United States Patent
Barrow

[19]
[11] Patent Number: 5,880,529
[45] Date of Patent: Mar. 9, 1999

[54] SILICON METAL-PILLAR CONDUCTORS UNDER STAGGER BOND PADS

[75] Inventor: Michael Barrow, El Dorado Hills, Calif.

[73] Assignee: Intel Corporation, Santa Clara, Calif.

[21] Appl. No.: 734,773

[22] Filed: Oct. 22, 1996

[51] Int. Cl.[6] .................................................. H01L 23/48
[52] U.S. Cl. ......................... 257/782; 438/612; 438/618; 257/784; 257/786
[58] Field of Search ..................................... 438/612, 618, 438/622, 666; 257/782, 786, 773, 758, 784

[56] References Cited

U.S. PATENT DOCUMENTS

| | | |
|---|---|---|
| 4,010,488 | 3/1977 | Gruszka et al. . |
| 4,928,162 | 5/1990 | Lesk et al. . |
| 5,394,013 | 2/1995 | Oku et al. . |
| 5,441,917 | 8/1995 | Rostoker et al. . |

FOREIGN PATENT DOCUMENTS 4-6850  1/1992  Japan .

*Primary Examiner*—Caridad Everhart
*Attorney, Agent, or Firm*—Blakely, Sokoloff, Taylor & Zafman LLP

[57] ABSTRACT

A bond pad layout for an integrated circuit die. The die includes a plurality of inner bond pads and a plurality of outer bond pads. To minimize the spacing pitch of the bond pads the die contains an inner layer of metallization that routes the outer bond pads to the inner portion of the integrated circuit. To enhance the structural integrity of the integrated circuit the die contains a plurality of dielectric pillars that support the bond pads. The inner layer of metallization is typically routed around the dielectric pillars so that the metallization does not create stress points in the die.

14 Claims, 3 Drawing Sheets

SILICON METAL-PILLAR CONDUCTORS UNDER STAGGER BOND PADS

BACKGROUND OF THE INVENTION

1. FIELD OF THE INVENTION

The present invention relates to a bond pad layout for an integrated circuit die.

2. DESCRIPTION OF RELATED ART

Integrated circuits are assembled into a package that is mounted to a printed circuit board. The integrated circuit die is typically supported by a substrate that has a plurality of internal bond fingers that are coupled to corresponding bond pads of the die. The substrate contains internal routing that connects the bond fingers to external contacts that are soldered to the printed circuit board. The bond fingers are typically connected to the die bond pads by bond wires.

FIG. 1 shows a conventional bond pad layout of an integrated circuit die 1. The bond pads 2 are arranged into two staggered rows that are coupled to the circuitry of the integrated circuit by lead traces 3. The lead traces 3 connected to the outer bond pads are routed between the inner bond pads. Routing the lead traces between the inner bond pads limits the spacing pitch of the bond pads and the current carrying capability of the traces. It is generally desirable to minimize the pitch of the bond pads to increase the number of bond pads, and/or reduce the size of the die.

The bond wires are typically attached to the bond pads with an automated bonding machine. The bonding machine exerts a certain amount of pressure on the bond pads during the bonding process. It is imperative that the bond pads and supporting die structure withstand the forces created by the automated bonding machine. Any cracks or other material deformation in the die may effect the operation of the integrated circuit. It would therefore be desirable to provide a bond pad structure that minimizes the spacing pitch of the pads and has enough structural integrity to withstand the forces exerted during an automated bonding process.

SUMMARY OF THE INVENTION

The present invention is a bond pad layout for an integrated circuit die. The die includes a plurality of inner bond pads and a plurality of outer bond pads. To minimize the spacing pitch of the bond pads the die contains an inner layer of metallization that routes the outer bond pads to the inner portion of the integrated circuit. To enhance the structural integrity of the integrated circuit the die contains a plurality of dielectric pillars that support the bond pads. The inner layer of metallization is typically routed around the dielectric pillars so that the metallization does not create stress points in the die.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
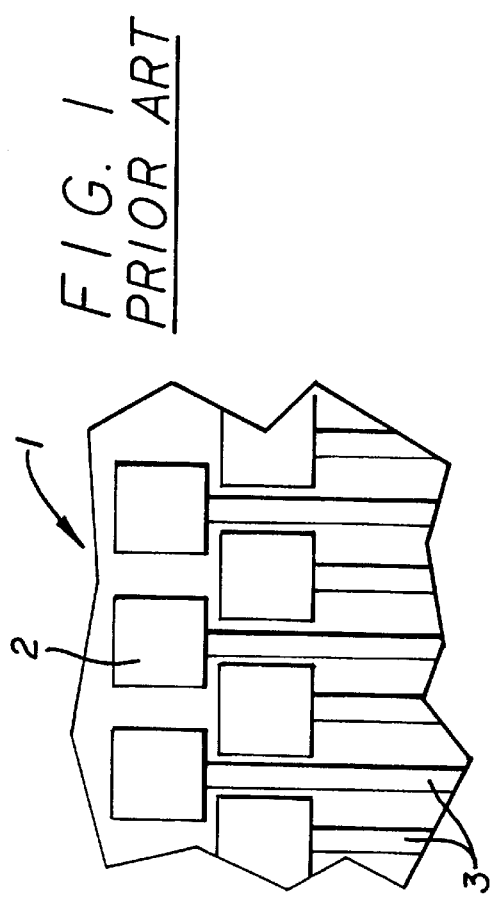
FIG. 1 is a top view of a bond pad layout of an integrated circuit die of the prior art.
Figure 2:
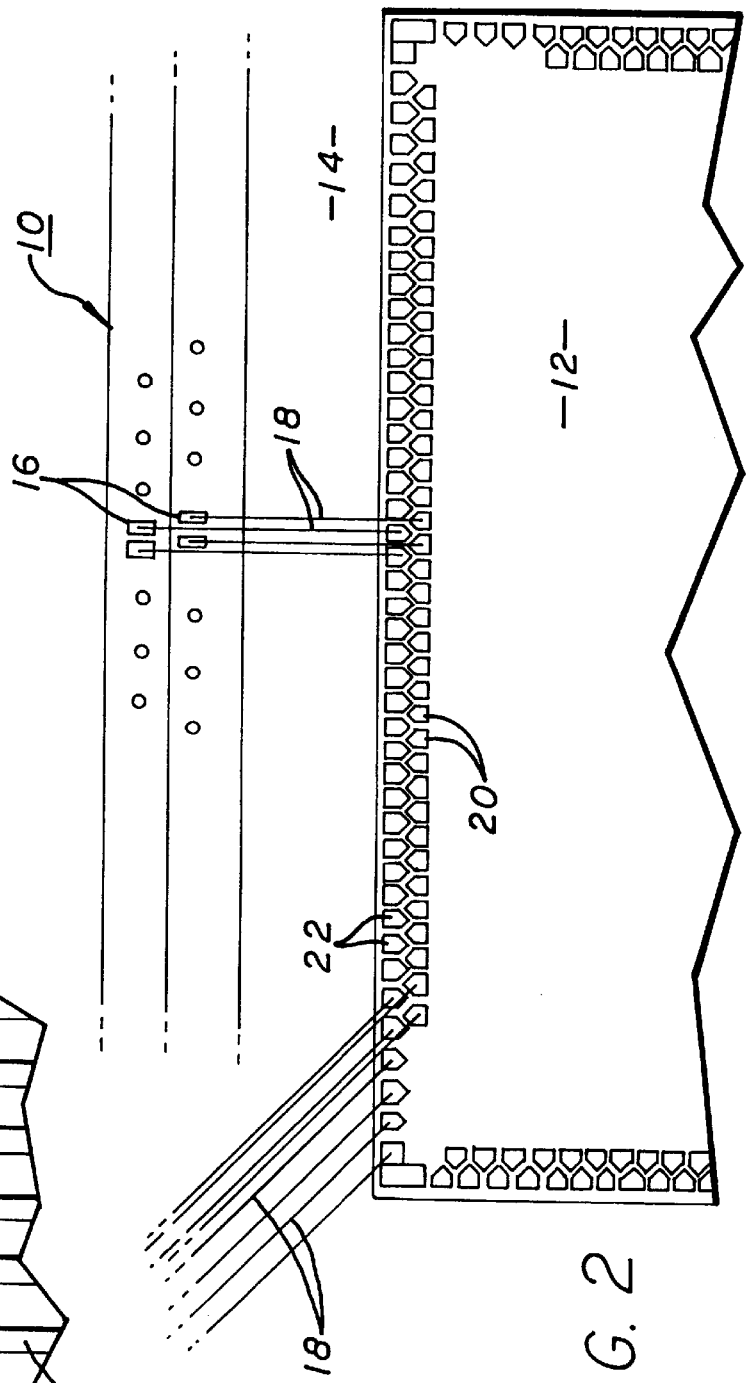
FIG. 2 is a top view of an integrated circuit package containing an integrated circuit of the present invention.

Referring to the drawings more particularly by reference numbers, FIG. 2 shows an integrated circuit package 10. The package 10 includes an integrated circuit die 12 that is mounted to a substrate 14. The substrate 14 contains a plurality of bond fingers 16 that are connected to the die 12 by a plurality of bond wires 18. The substrate 14 typically contains internal routing that connects the bond fingers 16 to external contacts (not shown) located on an external surface of the package 10. The external contacts are typically soldered to a printed circuit board (not shown). Although bond wires 18 are shown and described, it is to be understood that the die 12 may be connected to the bond fingers 16 by other means such as tape automated bonding.

The integrated circuit die 12 contains a plurality of inner bond pads 20 and a plurality of outer bond pads 22 located about the perimeter of the die 12. The bond wires 18 are connected to the bond pads 20 and 22 to couple the circuitry of the integrated circuit to the substrate 14 and the external printed circuit board. The integrated circuit 12 may be a microprocessor.

Figure 3:
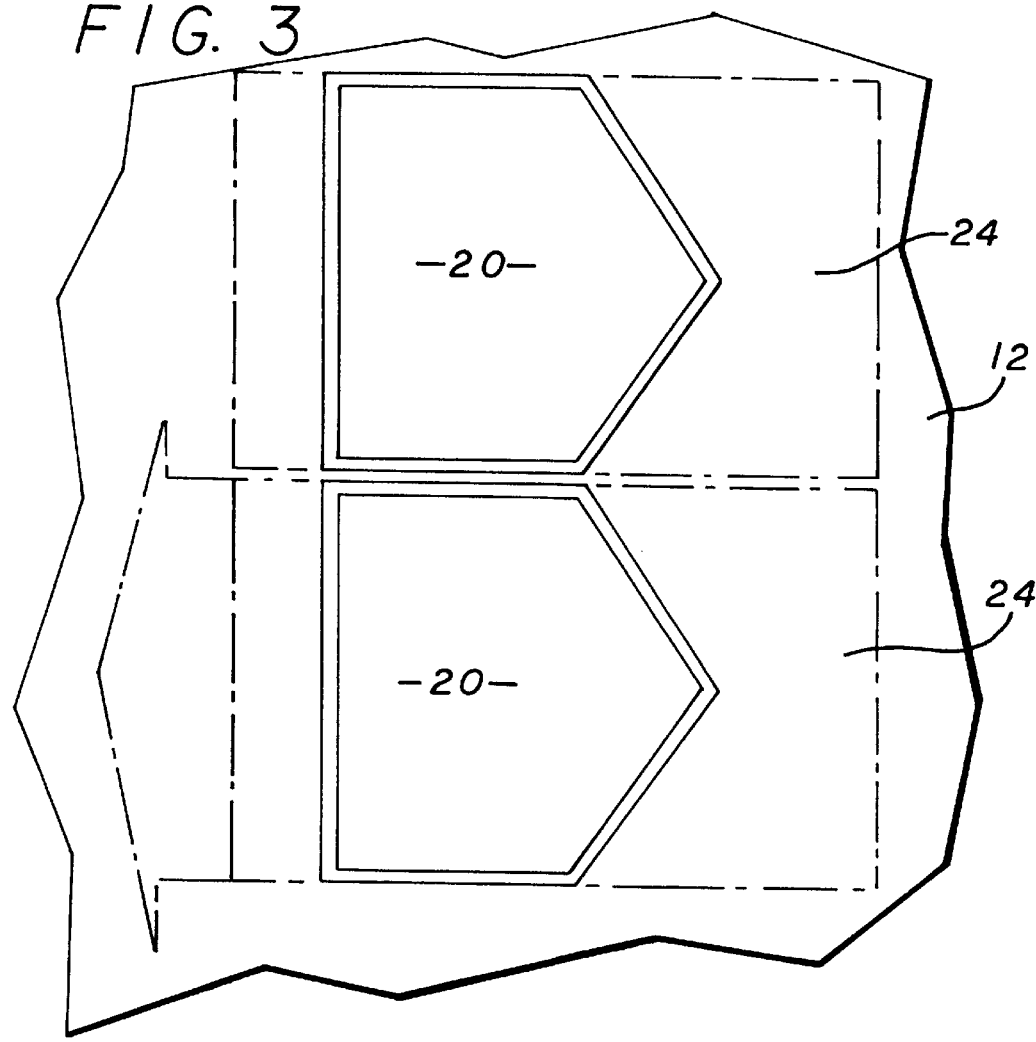
FIG. 3 is a enlarged top view showing a bond pad layout of the integrated circuit.
Figure 4:
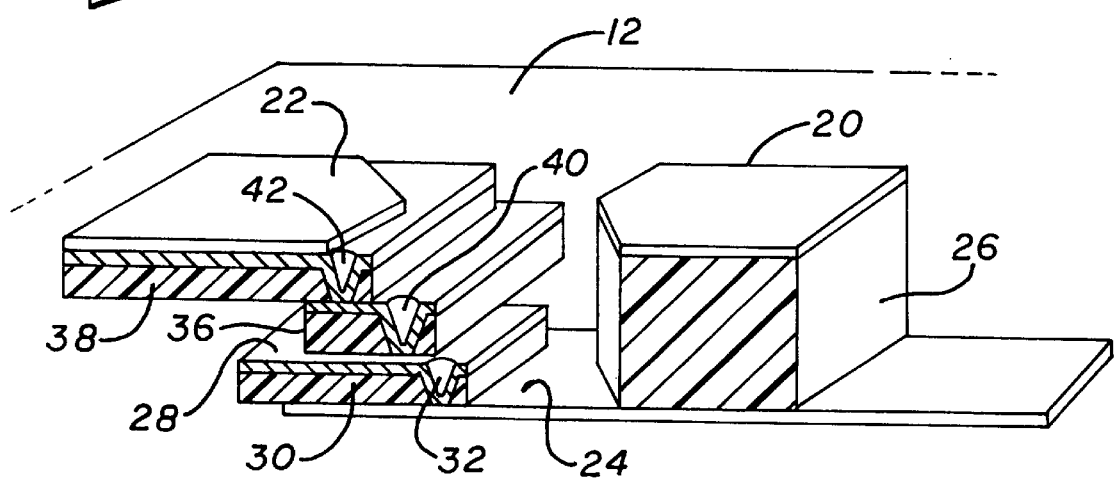
FIG. 4 is a perspective view showing the metallization layers of the integrated circuit of FIG. 3.

As shown in FIGS. 3 and 4, the die 12 has a first layer of metallization 24 that is electrically coupled to the outer bond pads 22 and is routed under the inner bond pads 20. Routing the metal under the inner bond pads 20 minimizes the pitch between adjacent bond pads and optimizes the bond pad density. The inner bond pads 20 are separated from the first layer of metallization 24 by a pillar of dielectric material 26. The pillar 26 provides a uniform structure that enhances the structural integrity of the die 12 and does not create stress points when the inner bond pads are loaded by an automated bonding machine.

The die 12 may have a second layer of metallization 28 that is separated from the first layer of metallization 24 by a first layer of dielectric 30. The second layer of metallization 28 may be electrically connected to the first layer 24 by first vias 32 that extend through the first layer of dielectric 30. The second layer of metallization 28 may be coupled to the outer bond pads 22 by a third layer of metallization 34. The third layer of metallization 34 is separated from the second layer of metallization 28 by a second layer of dielectric 36 and from the bond pads 22 by a third layer of dielectric 38. The third layer of metallization 34 is electrically connected to the second layer of metallization 28 by second vias 40 and to the outer bond pads 22 by third vias 42.

The bond pad portion of the die can be constructed by initially creating the first layer of metallization 24. The first layer of dielectric 30 is applied to the first layer of metallization 24 and the first vias 32 are formed therein. The second and third layers of metallization and dielectric, and corresponding vias are then formed in subsequent process steps. The bond pads are finally created on the third layer of dielectric 38. The pillar 26 is formed by the application of the first 30, second 36 and third 38 layers of dielectric.

Figure 5:
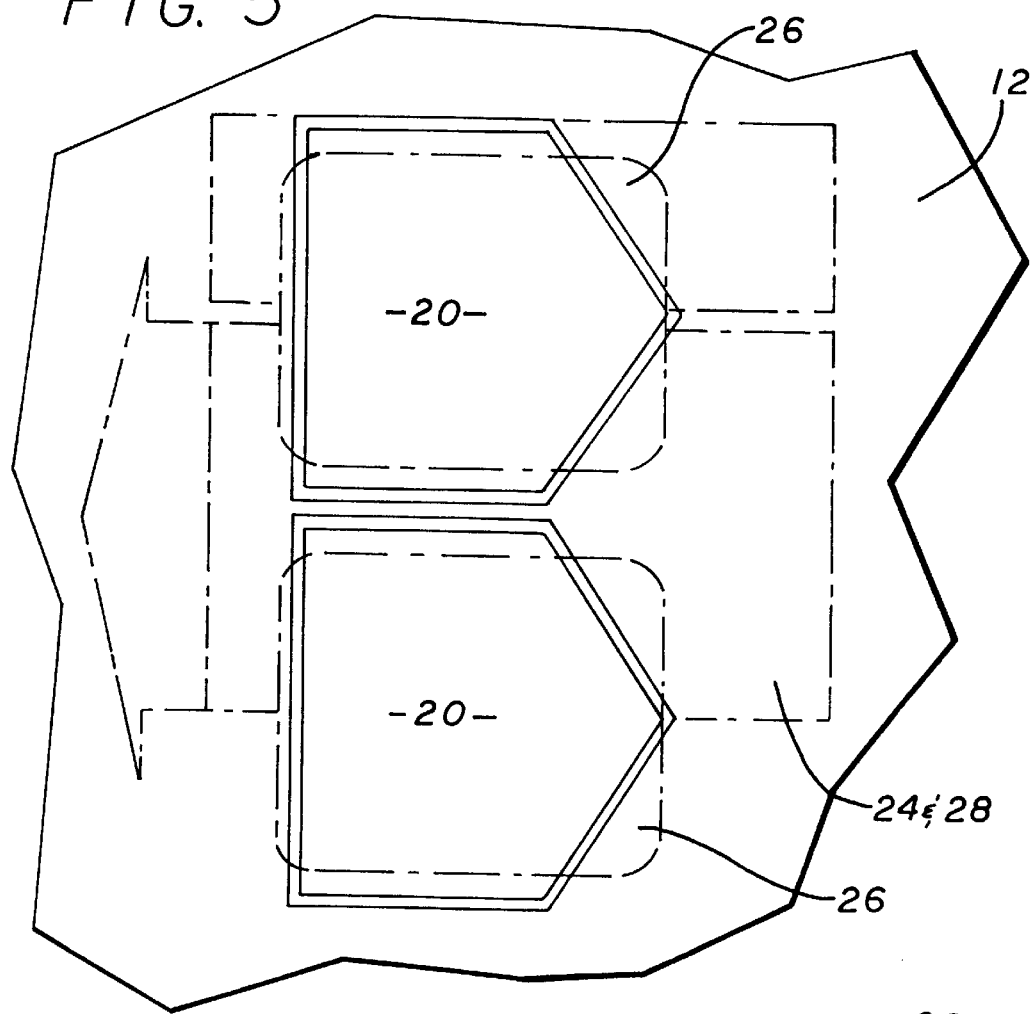
FIG. 5 is an enlarged top view of an alternate bond pad layout.
Figure 6:
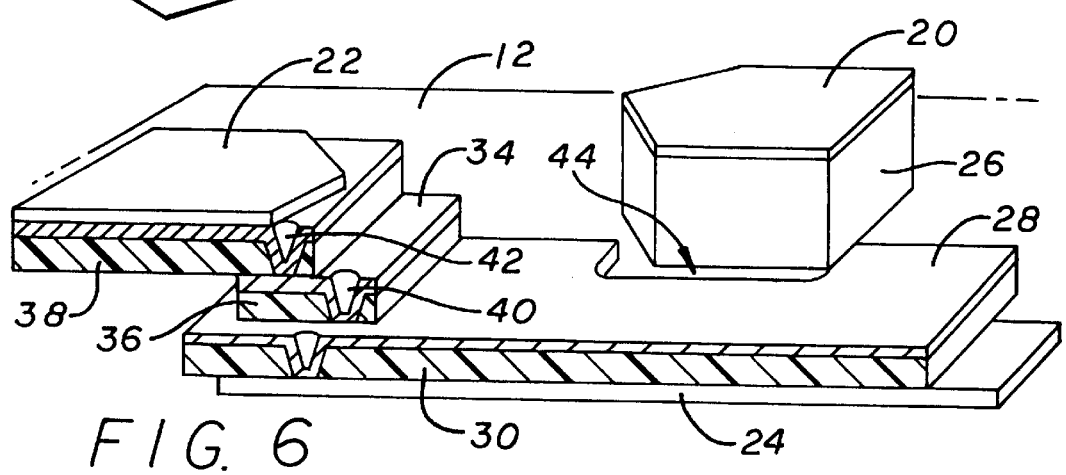
FIG. 6 is a perspective view showing the metallization layers of the integrated circuit of FIG. 5.

FIGS. 5 and 6 show an alternate embodiment of the bond pad layout portion of the die. To reduce the electrical resistance of the routing traces from the outer bond pads 22, both the first 24 and second 28 layers of metallization 28 may be coupled to the outer bond pads 22 and routed under the inner bond pads 20. The second layer of metallization 28 may have "cut-out" portions 44 that allow the dielectric pillar 26 to extend through the second layer 28. The cut-out portions 44 prevent a discontinuity in the thickness of the die which may create a stress point when the bond pads are loaded by the bonding machine. The first layer of metallization 24 may also have a cut-out portion to enhance the structural integrity of the die 12. To further increase the current carrying capability of the routing traces, the third layer of metallization 34 may also be routed under the inner bond pads 20.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Although three separate layers of metallization are shown and described, it is to be understood that the die may have any number of metal layers. For example, the die may include the bond pads 20 and 22 and the first layer 24 without the second 28 or third 34 layers of metallization.

What is claimed is:

1. An integrated circuit die, comprising:
    a die which has a plurality of outer bond pads, a plurality of inner bond pads, a first internal layer of metallization that is coupled to said outer bond pads and routed under said inner bond pads, and a dielectric pillar that separates said inner bond pads from said first internal layer of metallization.

2. The integrated circuit die as recited in claim 1, further comprising a second layer of metallization that couples said outer bond pads to said first layer of metallization.

3. The integrated circuit die as recited in claim 2, further comprising a third layer of metallization that couples said outer bond pads to said second layer of metallization.

4. The integrated circuit die as recited in claim 3, wherein said dielectric pillar extends through said second and third layers of metallization.

5. The integrated circuit die as recited in claim 4, wherein said first, second, third layers of metallization and said outer bond pads are coupled together by vias.

6. The integrated circuit die as recited in claim 2, wherein said second layer of metallization is routed under said inner bond pads.

7. An integrated circuit package, comprising:
    a substrate; and,
    a die that is mounted to said substrate, said die has a plurality of outer bond pads, a plurality of inner bond pads, a first internal layer of metallization that is coupled to said outer bond pads and routed under said inner bond pads, and a dielectric pillar that separates said inner bond pads from said first internal layer of metallization.

8. The integrated circuit package as recited in claim 7, further comprising a second layer of metallization that couples said outer bond pads to said first layer of metallization.

9. The integrated circuit package as recited in claim 8, further comprising a third layer of metallization that couples said outer bond pads to said second layer of metallization.

10. The integrated circuit package as recited in claim 9, wherein said dielectric pillar extends through said second and third layers of metallization.

11. The integrated circuit package as recited in claim 10, wherein said first, second, third layers of metallization and said outer bond pads are coupled together by vias.

12. The integrated circuit package as recited in claim 8, wherein said second layer of metallization is routed under said inner bond pads.

13. A method for constructing a plurality of bond pads on an integrated circuit die, comprising the steps of:
    a) creating a first layer of metallization;
    b) creating a first layer of dielectric on said first layer of metallization;
    c) creating a plurality of vias in said first layer of dielectric; and,
    d) creating a plurality of inner bond pads and a plurality of outer bond pads so that said first layer of metallization is routed under said inner bond pads from said outer bond pads and said outer bond pads are coupled to said first layer of metallization by said vias, wherein said inner bond pads are separated from said first layer of metallization by said first layer of dielectric.

14. A method for constructing an integrated circuit die, comprising the steps of:
    a) creating a first layer of metallization;
    b) creating a first layer of dielectric on said first layer of metallization;
    c) creating a plurality of first vias in said first layer of dielectric;
    d) creating a second layer of metallization that is coupled to said first layer of metallization by said first vias and separated from said first layer of metallization by said first layer of dielectric;
    e) creating a second layer of dielectric on said second layer of metallization;
    f) creating a plurality of second vias in said second layer of dielectric;
    g) creating a third layer of metallization that is coupled to said second layer of metallization by said second vias and separated from said second layer of metallization by said second layer of dielectric;
    h) creating a third layer of dielectric on said third layer of metallization;
    i) creating a plurality of third vias in said third layer of dielectric; and,
    j) creating a plurality of inner bond pads and a plurality of outer bond pads so that said first layer of metallization is routed under said inner bond pads from said outer bond pads and said outer bond pads are coupled to said third layer of metallization by said third vias, wherein said inner bond pads are separated from said first layer of metallization by said first, second and third layers of dielectric.

* * * * *